United States Patent [19]

Tanaka

[11] Patent Number: 5,744,831
[45] Date of Patent: Apr. 28, 1998

[54] SOLID-STATE IMAGE PICK-UP DEVICE

[75] Inventor: Hiroaki Tanaka, Kanagawa, Japan

[73] Assignee: Sony Corporation, Tokyo, Japan

[21] Appl. No.: 704,105

[22] Filed: Aug. 28, 1996

[30] Foreign Application Priority Data

Sep. 1, 1995 [JP] Japan ........................... 7-224858

[51] Int. Cl.$^6$ ...................... H01L 27/148; H01L 29/768
[52] U.S. Cl. ...................... 257/225; 257/222; 257/227; 257/230; 257/231; 257/233; 348/317; 348/319; 348/320
[58] Field of Search ...................... 257/222, 225, 257/227, 230, 231, 233; 348/317, 319, 320

[56] References Cited

U.S. PATENT DOCUMENTS

| 4,597,013 | 6/1986 | Matsumoto | 257/233 |
| 5,343,060 | 8/1994 | Abe | 257/229 |
| 5,471,246 | 11/1995 | Nishima et al. | 257/231 |
| 5,581,099 | 12/1996 | Kusaka et al. | 257/227 |

Primary Examiner—Valencia Martin Wallace
Attorney, Agent, or Firm—Hill, Steadman & Simpson

[57] ABSTRACT

A solid-state image pick-up device 20 having a photoreceiving section 3 disposed on the obverse surface of a substrate 2 and performing photoelectric conversion. A readout gate 5 is disposed at one end of the photoreceiving section 3. A channel stop 8 is disposed at the other end of the photoreceiving section 3. A vertical transfer register 7 is provided for each of the readout gate 5 and the channel stop 8 at the end opposite to the photoreceiving section 3. A transfer electrode 10 is located in a position substantially right above the vertical transfer register 7. A light-shielding film 21 is disposed in such a manner that the transfer electrode 10 can be covered and that the portion right above the photoreceiving section 3 can be at least partially opened. The width $W_3$ of the readout gate 5 is formed greater than the width $W_4$ of the channel stop 8. The width $W_5$ of the projecting portion 21b of the light-shielding film 21 adjacent to the readout gate 5 is formed smaller than the width $W_6$ of the projecting portion 21b near the channel stop 8.

7 Claims, 3 Drawing Sheets

SOLID-STATE IMAGE PICK-UP DEVICE

BACKGROUND OF THE INVENTION

FIGS. 3A and 3B illustrate a known charge-coupled device (CCD)-type solid-state image pick-up device. Therein, a solid-state image pick-up device generally designated by 1 is illustrated.

As illustrated in FIG. 3A, an overflow barrier (not shown) is formed on the obverse surface of a silicon substrate 2, and photoreceiving sections 3 . . . are deposited on the overflow barrier. A hole accumulation section 4 is further formed on each photoreceiving section 3. A readout gate 5 and a P well 6 are sequentially disposed at one end of the photoreceiving section 3, and a vertical transfer register 7 is further mounted on the P well 6. On the other hand, a channel stop 8 is disposed at the other end of the photoreceiving section 3. Further provided at the end of the channel stop 8 are another P well 6 and another vertical transfer register 7. A readout gate (not shown) and a photoreceiving section (not shown) are sequentially disposed at the end of the vertical transfer register 7.

As also illustrated, an $SiO_2$-formed insulating film 9 is deposited on the surface of the silicon substrate 2. Mounted on the insulating film 9 are transfer electrodes 10 that substantially cover the area corresponding to the top surfaces of the vertical transfer register 6, and the readout gate 5 and the channel stop 8 disposed at the respective ends of the transfer register 6. Another insulating film 11 is formed on the insulating film 9 in such a manner that it can cover the transfer electrodes 10. A light-shielding film 12 is deposited on the insulating film 11 in such a manner that the transfer electrode 10 can be covered and that the portion immediately above the photoreceiving section 3 can be partially opened. The light-shielding film 12 is formed of a portion immediately above the insulting film 11 that covers the top and lateral surfaces of the transfer electrode 10 and a projecting portion 12b extending from a step 11a of the insulating film 11 to the photoreceiving section 3. An opening 13 used for receiving light is formed, as shown in FIG. 3B, between the adjacent projecting portions 12b of the film 12. Also, as shown in FIG. 3A, a passivation layer 14 formed of a transparent material covering the light-shielding film 12 and so on is deposited on the substrate 2.

In the solid-state image pick-up device 1 constructed as described above, the incident light passing through the passivation layer 14 is received by the photoreceiving section 3 and is photoelectrically converted to electrical charges. The resulting charges are transferred to the vertical transfer register 7 via the readout gate 5. The transfer electrode 10 is driven to further transfer the charges within the vertical transfer register 7 and finally to be output as a signal via a horizontal transfer register (not shown).

In the above-described solid-state image pick-up device 1, there are some cases where light is obliquely incident on the device 1 depending on the f/stop number of a lens of an optical camera loaded with the device 1, and may disadvantageously enter between the surface of the silicon substrate 2 and the light-shielding film 12, as indicated by the arrow in FIG. 3A. The light partially reflects at the interface between the silicon substrate 2 and the insulating film 9 and impinges on the bottom surface of the projecting portion 12b of the light-shielding film 12. Then, the above component of light repeats multiple reflection between the bottom surface of the light-shielding film 12 and the obverse surface of the silicon substrate 2 and directly enters the vertical transfer register 7. The light is photoelectrically converted to generate electrons, thereby causing smear. It should be noted that, although the arrow is shown only near the readout gate 5 in FIG. 3A, smear is also produced adjacent to the channel stop 8 according to a similar mechanism.

Smear is not desirable and preferably is reduced, particularly when the image of a high-brilliance subject is taken, since the resulting subject appears to be vertically extended beyond its normal position on the monitor screen. One of the conventional measures to decrease the level of smear is, for example, to increase the widths $W_1$ and $W_2$ of the projecting portion 12b of the light-shielding film 12 shown in FIGS. 3A and 3B, or to increase the width $W_3$ of the readout gate 5 and the width $W_4$ of the channel stop 8, thereby lengthening the distance from the peripheral edge of the opening 13 formed between the projecting portions 12b of the film 12 to the vertical transfer register 7.

In a conventional solid-state image pick-up device, such as shown in FIG. 3, the opening is located at the center 15 of the photoreceiving section 3. The width $W_1$ of the projecting portion 12b adjacent to the readout gate 5 is equal to the width $W_2$ of the projecting portion 12b adjacent to the channel stop 8; and on the other hand, there is a difference between the width $W_3$ of the readout gate 5 and the width $W_4$ of the channel stop 8, i.e, the width $W_3$ is made greater than the width $W_4$. This is because each width is decreased to a minimal level in response to the reduced pixel size along with an increase in the pixel number, and also because the conditions determining the widths of the readout gate 5 and the channel stop 8 are different. Namely, in order to improve the aperture efficiency of the sensor along with the decreased pixel size along with an increase in the pixel number, it is necessary for the unit cell of the device that the widths (areas) of the readout gate 5, the vertical transfer register 7 and the channel stop 8 be decreased as much as possible. The area of the vertical transfer register 7 is determined by the required amount of charges to be handled, while the width of the channel stop 8 can be reduced to a certain degree, such as to the limit of photolithography. However, the width of the readout gate 5 should be greater than the width of the channel stop 8, since the readout gate 5 requires a sufficient width to prevent blooming (the phenomenon in which signal charges are excessively generated in the photoreceiving section by intensified light and overflow to the peripheral pixels).

In contrast, the width of the projecting portion 12b of the light-shielding film 12 adjacent to the readout gate 5 is, in general, equal to the width of the projecting portion 12b adjacent to the channel stop 8. This may be because it is necessary to keep the smear component in balance between the area adjacent to the readout gate 5 and the area near the channel stop 8. Insufficient widths of the projecting portions 12b often encourages the occurrence of smear. However, the level of smear is determined not only by the width of the projecting portion 12b, but also the distance from the peripheral edge of the opening 13 to the vertical transfer register 7 (the width of the readout gate 5 and the width of the channel stop 8), though it is varied depending on the pixel size. A greater distance from the peripheral edge of the opening 13 to the vertical transfer register 7 inhibits the level of smear. As a consequence, the occurrence of smear is promoted in the vertical transfer register 7 adjacent to the stop channel 8 because of a smaller distance from the peripheral edge of the opening 13 to the vertical transfer register 7. This is not desirable for a device in which priority is given to a decrease in the level of smear, though the above type of design is unavoidable for a device in which priority is given to sensitivity.

SUMMARY OF THE INVENTION

In view of the above background, it is an object of the present invention to provide a solid-state image pick-up device in which smear characteristics are improved.

In order to achieve the above object, in one embodiment of the present invention, there is provided a solid-state image pick-up device comprising: a photoreceiving section disposed on the obverse surface of a substrate for performing photoelectric conversion; a readout gate disposed at one end of the photoreceiving section along the column of the photoreceiving section; a channel stop disposed at the other end of the photoreceiving section along the column of the photoreceiving section; a vertical transfer register provided for each of the readout gate and the channel stop at the end opposite to the photoreceiving section; a transfer electrode disposed on the substrate and in a position substantially right above the vertical transfer register; and a light-shielding film having a projecting portion extending to the area right above the photoreceiving section, the film being disposed in such a manner that the transfer electrode is covered and that the portion right above the photoreceiving section is at least partially opened, wherein the width of the readout gate is formed greater than the width of the channel stop, and wherein the width of the projecting portion adjacent to the readout gate is formed smaller than the width of the projecting portion adjacent to the channel stop.

According to the solid-state image pick-up device of this embodiment of the present invention, the width of the readout gate is formed greater than the width of the channel stop, and also, the width of the projecting portion of the light-shielding film, which extends to the area right above the photoreceiving section, adjacent to the readout gate is formed smaller than the width of the projecting portion near the channel stop. Accordingly, the distance from the peripheral edge of the opening used for allowing light to be incident on the photoreceiving section to the vertical transfer register adjacent to the readout gate is not greatly different from the associated distance near the channel stop. Thus, smear characteristics of the vertical transfer register can be kept in balance between the readout gate and the channel stop, thereby improving the smear characteristics of the overall solid-state image pick-up device.

In another embodiment of the present invention, there is provided a solid-state image pick-up device comprising: a photoreceiving section disposed on the obverse surface of a substrate for performing photoelectric conversion; a readout gate disposed at one end of the photoreceiving section along the column of the photoreceiving section; a channel stop disposed at the other end of the photoreceiving section along the column of the photoreceiving section; a vertical transfer register provided for each of the readout gate and the channel stop at the end opposite to the photoreceiving section; a transfer electrode disposed on the substrate and in a position substantially right above the vertical transfer register; and a light-shielding film having a projecting portion extending to the area right above the photoreceiving section, the film being disposed in such a manner that the transfer electrode is covered and that the portion right above the photoreceiving section is at least partially opened, wherein the width of the readout gate is formed smaller than the width of the channel stop, and wherein the width of the projecting portion adjacent to the readout gate is formed greater than the width of the projecting portion adjacent to the channel stop.

According to the solid-state image pick-up device of the latter embodiment of this invention, the width of the readout gate is formed smaller than the width of the channel stop, and also, the width of the projecting portion of the light-shielding film, which extends to the area right above the photoreceiving section, adjacent to the readout gate is formed greater than the width of the projecting portion near the channel stop. Accordingly, as in the device according to the former embodiment of the present invention, the distance from the peripheral edge of the opening to the vertical transfer register adjacent to the readout gate is not greatly different from the associated distance near the channel stop. Thus, smear characteristics of the vertical transfer register can be kept in balance between the readout gate and the channel stop, thereby enhancing the smear characteristics of the overall solid-state image pick-up device.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

The present invention will now be described in detail by way of several presently preferred embodiments. Japanese priority application No. P07-224858 is hereby incorporated by reference.

Figure 1A:
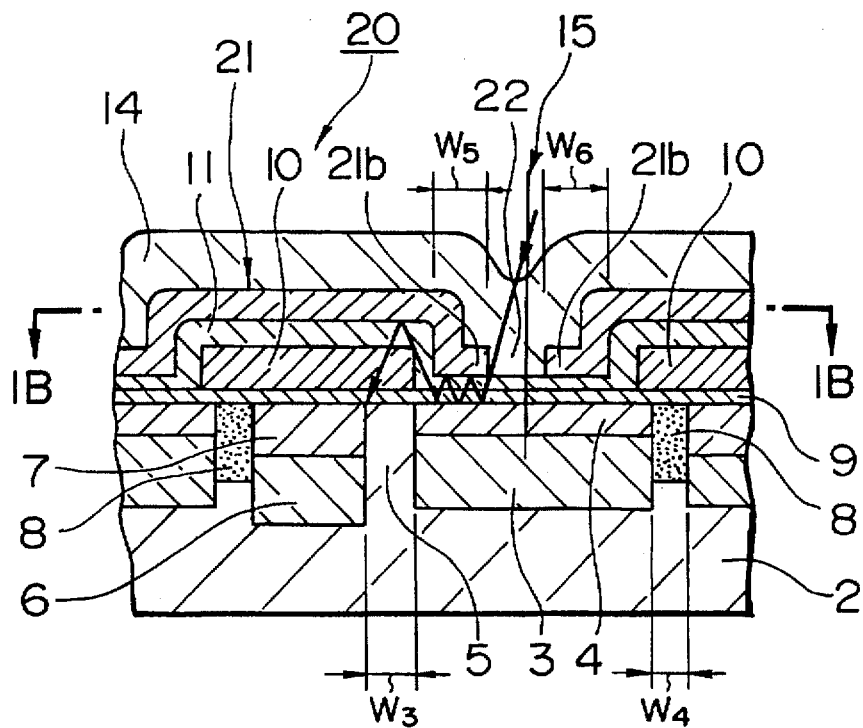
FIG. 1A is a cross sectional view of an embodiment of a solid-state image pick-up device according to the present invention.
Figure 1B:
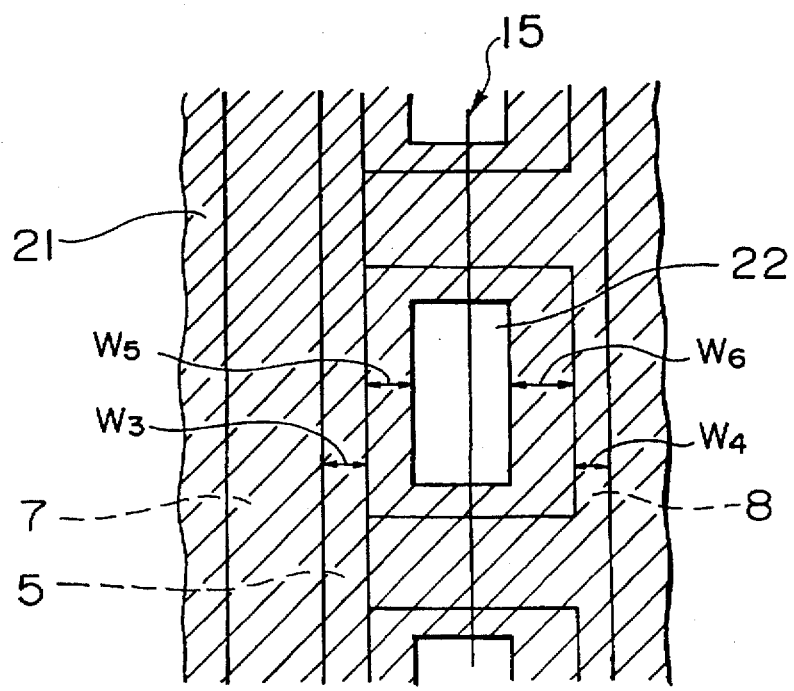
FIG. 1B is an elevational view in section along line B—B of FIG. 1A.
Figure 3A:
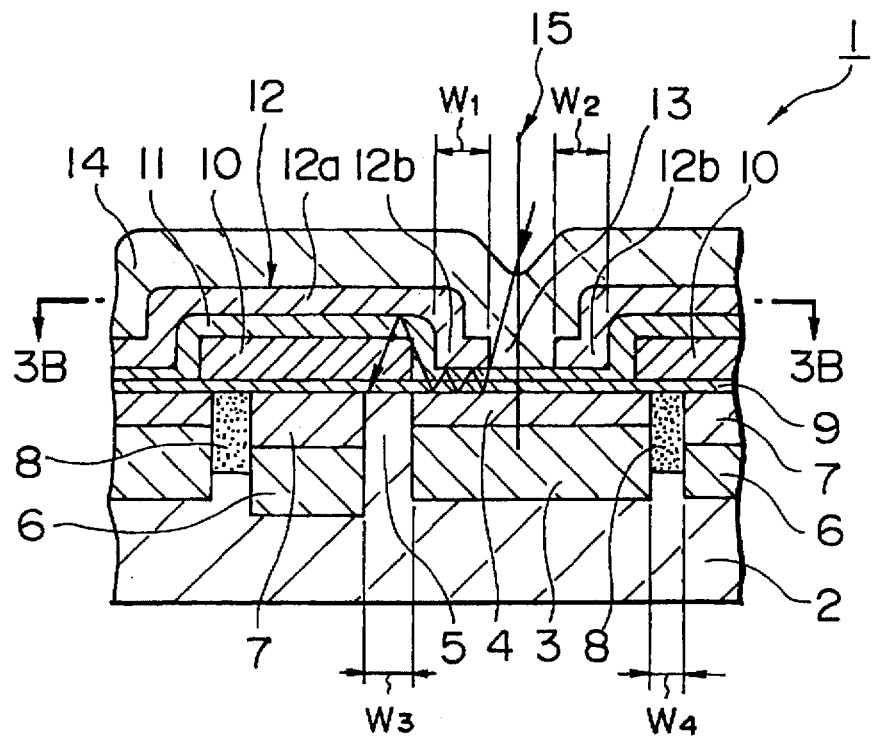
FIG. 3A is a cross sectional view of a conventional image pick-up device.
Figure 3B:
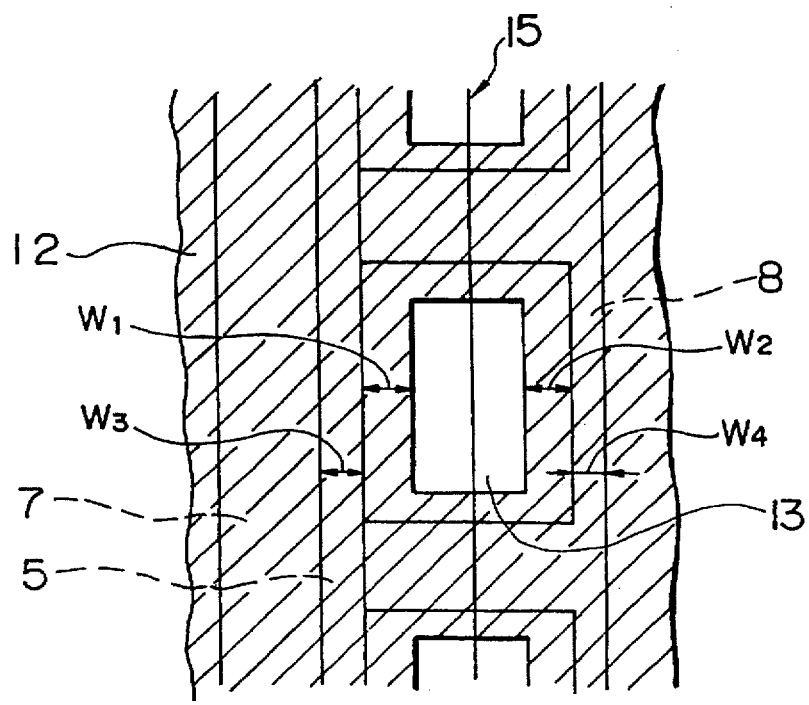
FIG. 3B is an elevational view in section along line B—B of FIG. 3A.

FIGS. 1A and 1B illustrate a first embodiment of a solid-state image pick-up device of the present invention. The same elements of a solid-state image pick-up device generally designated by 20 as those shown in FIGS. 3A and 3B are indicated by like reference numerals, and an explanation thereof will thus be omitted. The image pick-up device 20 shown in FIG. 1 differs from the device 1 illustrated in FIG. 3 in the widths of the projecting portions of the light-shielding film.

More specifically, in the solid-state image pick-up device 20 of this embodiment, as shown in FIGS. 1A and 1B, the width $W_5$ of the projecting portion 21b of the Al-formed light-shielding film 21 adjacent to the readout gate 5 is made smaller than the width $W_6$ of the projecting portion 21b adjacent to the channel stop 8. In other words, the opening 22 is located off center from a center line 15 of said photoreceiving section 3 and closer to the readout gate 5 than the channel stop 8. On the other hand, the width $W_3$ of the readout gate 5 is made larger than the width $W_4$ of the channel stop 8, as has been conventionally constructed.

According to the solid-state image pick-up device 20 constructed as described above, the distance from the peripheral edge of the opening 22 formed between the projecting portions 21b, 21b of the light-shielding film 21

(FIG. 1B) to the vertical transfer register 7 near the readout gate 5 is substantially equal to the corresponding distance adjacent to the channel stop 8. Namely, since the width $W_3$ is greater than the width $W_4$, and the width $W_5$ is smaller than the width $W_6$, i.e., since $W_3 > W_4$, and $W_5 < W_6$, the expression $W_3 + W_5 \approx W_4 + W_6$ can hold true. $W_3 + W_5$ is substantial to the distance between the opening 22 and the vertical transfer register 7 located at the left side of said opening 22. And $W_4 + W_6$ is substantially equal to the distance between the opening 22 and the vertical transfer register located at the right side of said opening 22. It should be noted that the distance between the lateral surface of the transfer electrode 10 and the inner lateral surface of the light-shielding film 21 adjacent to the readout gate 5 and the distance therebetween adjacent to the channel stop 8 can be equal to each other, since both of the distances are equivalent to the thickness of the insulating film 11, as shown in FIG. 1A. In this manner, in the solid-state image pick-up device 20 of this embodiment, the distance between the peripheral edge of the opening 22 and the vertical transfer register 7 adjacent to the readout gate 5 is substantially equivalent to the distance therebetween adjacent to the channel stop 8, whereby smear characteristics of the vertical transfer register can be kept in balance between the readout gate 5 and the channel stop 8. As a result, the smear characteristics of the overall device can be enhanced.

Figure 2A:
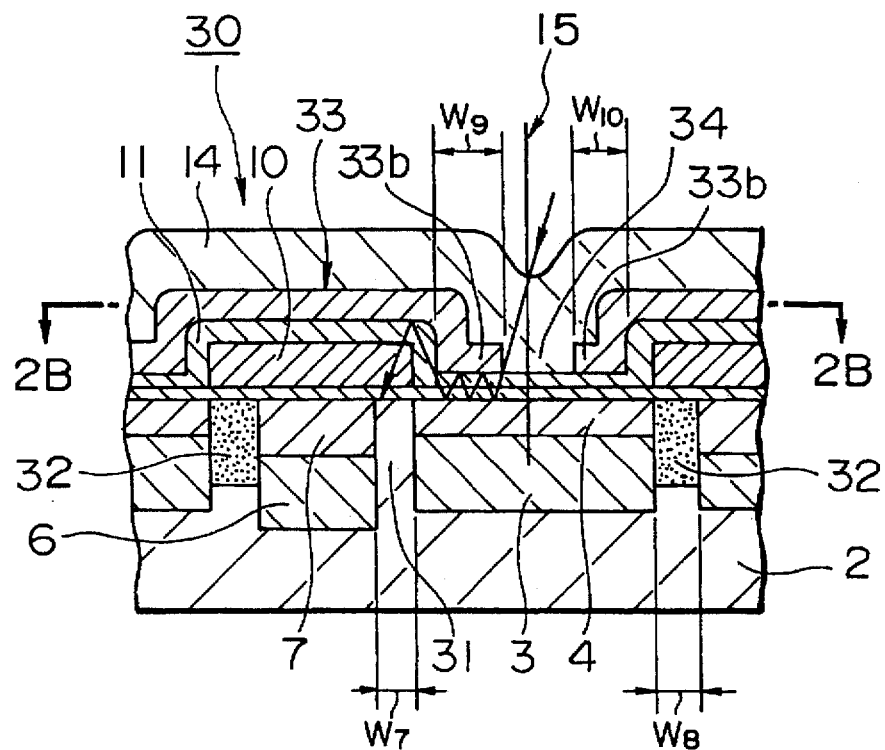
FIG. 2A is a cross sectional view of another embodiment of a solid-state image pick-up device according to the present invention.
Figure 2B:
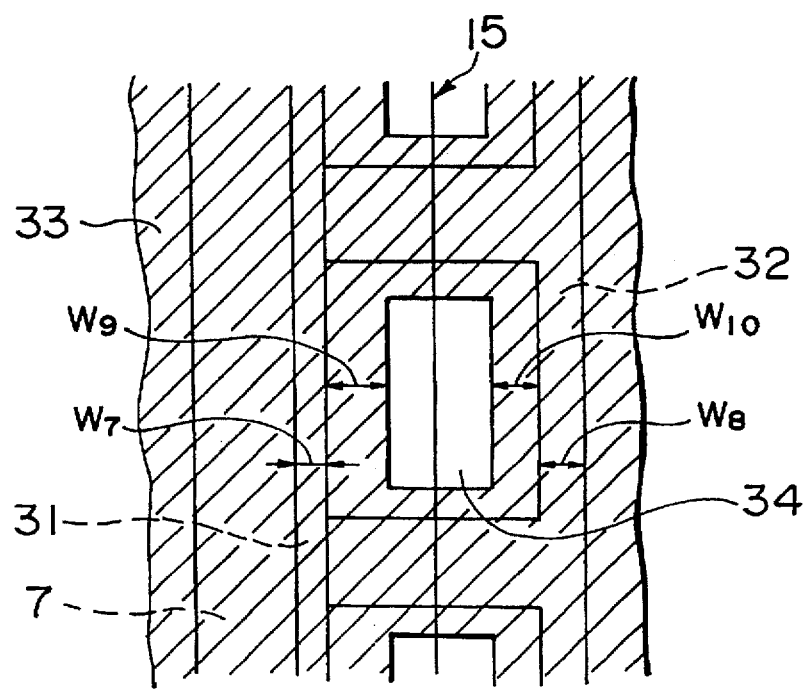
FIG. 2B is an elevational view in section along line B—B of FIG. 2A.

FIGS. 2A and 2B illustrate another embodiment of a solid-state image pick-up device according to the present invention. A solid-state image pick-up device generally designated by 30 differs from the device 1 shown in FIGS. 3A and 3B in the widths of the readout gate and the channel stop and the widths of the projecting portions of the light-shielding film. More specifically, in the solid-state image pick-up device 30 of this embodiment, unlike the conventional device, the width $W_7$ of the readout gate 31 is made smaller than the width $W_8$ of the channel stop 32, as shown in FIGS. 2A and 2B. On the other hand, the width $W_9$ of the projecting portion 33b of the Al-formed light-shielding film 33 adjacent to the readout gate 31 is made greater than the width $W_{10}$ of the projecting portion 33b adjacent to the channel stop 32. In other words, the opening 34 is located off center from the center line 15 of said photoreceiving section 3 and closer to the readout gate 31 than the channel stop 32.

With this arrangement, in the solid-state image pick-up device 30 the distance from the peripheral edge of the opening formed between the projecting portions 33b, 33b of the light-shielding film 33 (FIG. 2B) to the vertical transfer register 7 near the readout gate 31 is substantially equal to the associated distance near the channel stop 32. Namely, since the width $W_7$ is smaller than the width $W_8$, and the width $W_9$ is greater than the width $W_{10}$, i.e., since $W_7 < W_8$, and $W_9 > W_{10}$, the expression $W_7 + W_9 \approx W_8 + W_{10}$ can hold true. $W_7 + W_9$ is substantially equal to the distance between the opening 34 and the vertical transfer register 7 located at the left side of said opening 34. And $W_8 + W_{10}$ is substantially equal to the distance between the opening 34 and the vertical transfer register located at the right side of said opening 34. It should be noted that the distance between the lateral surface of the transfer electrode 10 and the inner lateral surface of the light-shielding film 33 adjacent to the readout gate 31 and the distance therebetween adjacent to the channel stop 32 can be equal, as in the embodiment shown in FIG. 1A, since both of the distances are equivalent to the thickness of the insulating film 11, as shown in FIG. 2A.

In this manner, in the solid-state image pick-up device 30 of this embodiment, as well as in the device 20 of the previous embodiment, the distance between the peripheral edge of the opening 34 and the vertical transfer register 7 adjacent to the readout gate 31 is substantially equivalent to the distance therebetween adjacent to the channel stop 32 in the overall device, i.e., in all photoreceiving sections in an imaging device, whereby smear characteristics of the vertical transfer register 7 can be kept in balance between the readout gate 31 and the channel stop 32. As a result, an improvement can be made of the smear characteristics of the overall device.

As is clearly understood from the foregoing description, the solid-state image pick-up device of the present invention is advantageous. There is no great difference between the distance from the peripheral edge of the opening formed between the projecting portions of the light-shielding film to the vertical transfer register adjacent to the readout gate and the corresponding distance adjacent to the channel stop, i.e., the distances are substantially equal to each other, whereby smear characteristics of the vertical transfer register can be maintained in balance between the readout gate and the channel stop. As a consequence, smear characteristics of the overall device can be significantly improved over those of the conventional devices Although modifications and changes may be suggested by those skilled in the art, it is the intention of the inventors to embody within the patent warranted hereon all changes and modifications as reasonably and properly come within the scope of their contribution to the art.

I claim:

1. A solid-state image pick-up device comprising:
   a photoreceiving section for performing photoelectric conversion, disposed on a substrate;
   a first shift register provided on a side of said photoreceiving section via a readout gate having a first width;
   a second shift register provided on the opposite side of said photoreceiving section via a channel stop region having a second width different from said first width; and
   a light shielding film formed over said first and second shift registers and having an opening above said photoreceiving section, said opening located off center from a center line of said photoreceiving section in a direction extending between said opening and said first and second shift registers and substantially equidistant between said first and second shift registers.

2. A solid-state image pick-up device according to claim 1, wherein said first width is wider than said second width.

3. A solid-state image pick-up device according to claim 2, wherein a distance equal to a distance between said first shift register and said opening and said first width is substantially the same as that equal to a distance between said second shift register and said opening and said second width.

4. A solid-state image pick-up device according to claim 1, wherein said second width is wider than said first width.

5. A solid-state image pick-up device according to claim 4, wherein a distance equal to a distance between said first shift register and said opening and said first width is substantially the same as that equal to a distance between said second shift register and said opening and said second width.

6. A solid-stage image pick-up device comprising:
   a photoreceiving section disposed on a surface of a substrate for performing photoelectric conversion;
   a readout gate disposed at one end of said photoreceiving section;
   a channel stop disposed at the other end of said photoreceiving section;

a vertical transfer register provided for each of said readout gate and said channel stop at the end opposite to said photoreceiving section;

a transfer electrode disposed on said substrate and in a position substantially right above said vertical transfer register; and a light-shielding film with an opening and having a projecting portion extending to the area right above said photoreceiving section to define a periphery of the opening, said film being disposed in such a manner that said transfer electrode is covered and that the opening is positioned over said photoreceiving section and in off-center relationship to said photoreceiving section, but in substantially equidistant relationship between said vertical transfer registers, wherein the width of said readout gate is formed greater than the width of said channel stop, and wherein the width of the projecting portion adjacent to said readout gate is formed smaller than the width of the projecting portion adjacent to said channel stop so that smear characteristics between said vertical transfer registers are substantially in balance.

7. A solid-state image pick-up device comprising:

a photoreceiving section disposed on a surface of a substrate for performing photoelectric conversion;

a readout gate disposed at one end of said photoreceiving section;

a channel stop disposed at the other end of said photoreceiving section;

a vertical transfer register provided for each of said readout gate and said channel stop at the end opposite to said photoreceiving section;

a transfer electrode disposed on said substrate and in a position substantially right above said vertical transfer register; and a light-shielding film with an opening and having a projecting portion extending to the area right above said photoreceiving section to define a periphery of the opening, said film being disposed in such a manner that said transfer electrode is covered and that the opening is positioned over said photoreceiving section and in off-center relationship to said photoreceiving section, but in substantially equidistant relationship between said vertical transfer registers, wherein the width of said readout gate is formed smaller than the width of said channel stop, and wherein the width of the projecting portion adjacent to said readout gate is formed greater than the width of the projecting portion adjacent to said channel stop.

* * * * *